United States Patent [19]

Baptiste

[11] 4,196,507
[45] Apr. 8, 1980

[54] METHOD OF FABRICATING MNOS TRANSISTORS HAVING IMPLANTED CHANNELS

[75] Inventor: Burchell B. Baptiste, Somerset, N.J.

[73] Assignee: RCA Corporation, New York, N.Y.

[21] Appl. No.: 936,912

[22] Filed: Aug. 25, 1978

[51] Int. Cl.² .............................................. B01j 17/00
[52] U.S. Cl. ......................................... 29/571; 29/579
[58] Field of Search .......................... 29/571, 578, 579

[56] References Cited

U.S. PATENT DOCUMENTS

| 3,758,943 | 9/1973 | Shibata ................................... 29/579 |
| 3,898,353 | 8/1975 | Napoli ..................................... 29/571 |
| 4,084,987 | 4/1978 | Godber ................................... 29/579 |

*Primary Examiner*—W. C. Tupman
*Attorney, Agent, or Firm*—Birgit E. Morris; D. S. Cohen; Sanford J. Asman

[57] ABSTRACT

The method of forming an MNOS transistor having a stepped channel oxide region utilizes intentional undercutting of the oxide in the channel region to provide a self-aligned mask for ion implanting a region of the same conductivity type, but more heavily doped which will be centrally located beneath the thin portion of the channel region in order to increase the threshold window of the device while saving a photomask operation.

10 Claims, 4 Drawing Figures

METHOD OF FABRICATING MNOS TRANSISTORS HAVING IMPLANTED CHANNELS

The present invention relates to metal nitride oxide semiconductor (MNOS) insulated gate field effect transistors (IGFETs).

MNOS transistors are usually fabricated as P-channel transistors on silicon wafers which are of N-type conductivity having a donor concentration on the order of about $10^{15}$ to $5 \times 10^{15}$ donor impurities/cm$^3$. At such doping levels, about one-third of the useable threshold window lies within the depletion region, and in the case of stepped oxide devices, is essentially wasted. By implanting a donor impurity, such as phosphorus or arsenic, in the portion of the channel in which tunneling is possible, the threshold window is shifted by about 2 or 3 volts, increasing the useable threshold window by that amount since the high conduction threshold remains fixed by the thick portion of the channel oxide. However, subsequent high temperature processing can cause the implantations to laterally diffuse under the thick oxide thereby increasing the high conduction threshold and reducing the total threshold window. Heretofore, two different masking operations were used in order to prevent that occurrence. The first portion was intended to open the thin oxide, and a second masking operation, which used a narrower mask, was used to provide an opening through which ions could be implanted into the channel. The use of two photomask steps is not desirable because the yield of semiconductor devices decreases as additional photolithography steps are added to the manufacturing process. Accordingly, a technique which does not require a second photomask step is desirable.

Figure 1:
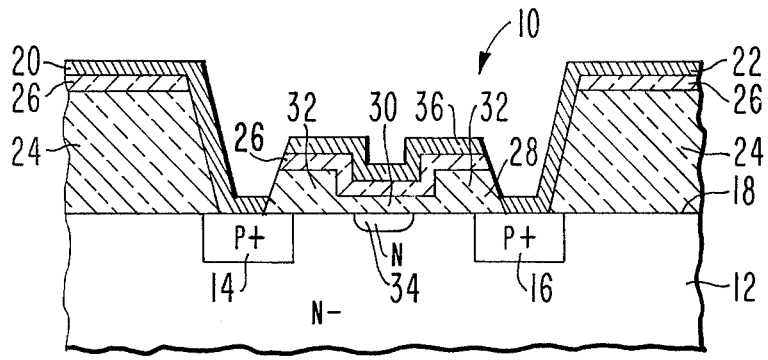
FIG. 1 is a cross-sectional view of the device of the present invention.

Referring to FIG. 1 a cross sectional view of a P-channel MNOS (PMNOS) insulated gate field effect transistor 10 is shown. The PMNOS IGFET comprises a body of semiconductor material 12, in this case N-type silicon having a doping concentration on the order of $2.5 \times 10^{15}$ donor atoms/cm$^3$. A P+ drain 14 and a P+ source 16 are formed in the body 12 and extend to a surface 18 of the body. Metal interconnects 20, 22 make contact to the drain 14 and source 16, respectively. Thick field oxide regions 24 overlie the surface 18 outside of regions where active transistors are formed. Between the drain 14 and source 16 is the active region of transistor 10. A silicon nitride layer 26 extends over a stepped channel oxide 28 which is comprised of a thin central portion 30 and thicker end portions 32. An N type region 34 underlies the central portion 30 of the channel oxide 28. Finally, a conductive gate 36 extends over the silicon nitride layer 26.

Figure 2:
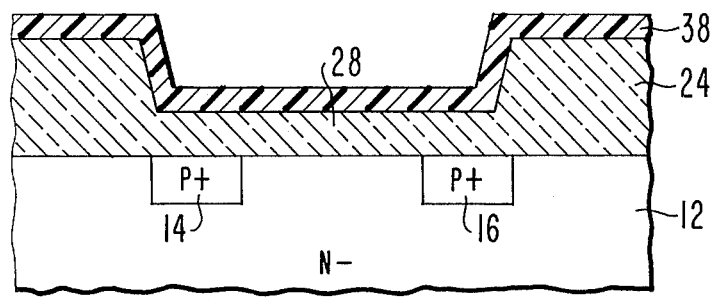
FIGS. 2-4 are cross-sectional views showing the method of manufacturing the device of FIG. 1.

Much of the processing used in making PMNOS transistors of the type described herein is well known in the prior art and need not be explained herein. Accordingly, for the purpose of explaining the method employed in the present invention, it will be assumed that the structure shown in FIG. 2 has been made using conventional processing techniques. In particular, the source 14 and drain 16 have been formed in the body 12, the field oxide 24 has been formed over the surface 18, and the portion of the field oxide 24 lying between the drain 14 and source 16 has been removed and replaced by a thermally grown oxide 28 having a thickness of about 500 Å. Then, a photoresist layer 38 is applied to the surface of the oxide layers 24, 28.

Figure 3:
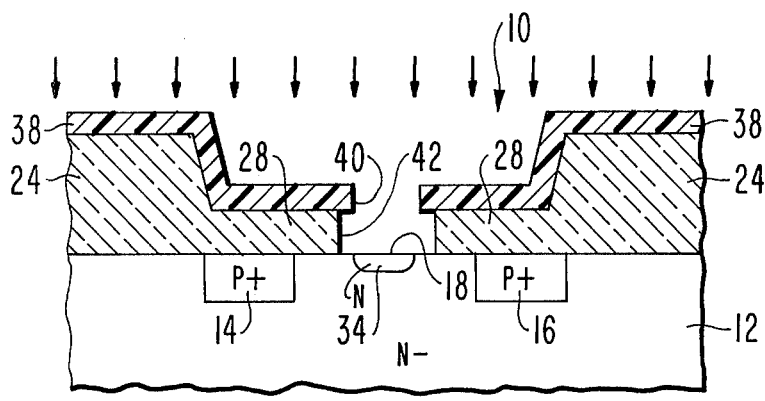

Next, an opening 40 in the photoresist layer 38 is defined using a photomask, and then it is developed. Referring to FIG. 3, the partially formed IGFET 10 is placed in a solution of buffered hydrofluoric acid which is capable of etching the portions of the oxide layer 28 which are exposed through the developed photoresist layer 38. Since the oxide layer 28 is only about 500 Å thick, the buffered hydrofluoric acid solution is capable of etching through layer 28 to the surface 18 in about 30 to 40 seconds. However, the partially formed IGFET 10, is left in the solution for about 8-10 minutes in order to remove the exposed portions of the oxide 28 and to continue the etch laterally beneath the photoresist layer 38 as shown in FIG. 3. An aperture 42 which is larger than opening 40 in the photoresist layer 38, is thereby formed in the oxide layer 28.

The formation of the aperture 42 in the manner described is crucial to the present invention, because it allows the opening 40 to be used as an ion implantation mask while insuring that the region which is implanted into the substrate 12 will not extend laterally beyond the central portion 30 of the gate oxide as shown in FIG. 1. In accordance with the present invention the structure is subjected to a uniform donor implantation by a donor impurity, such as phosphorus or arsenic (depicted by the arrows in FIG. 3) in order to form the shallow region 34 which extends into the body 12 from the surface 18 beneath the opening 40 in the photoresist layer 38. As a result of the manner in which the aperture 42 is formed the region 34 does not extend laterally along the surface 18 for the full distance of the aperture 42 but remains located beneath the aperture 40, instead. In the preferred embodiment of the invention the phosphorus or arsenic is implanted to a dosage surface concentration of about $5 \times 10^{12}$ atoms/cm$^2$.

Figure 4:
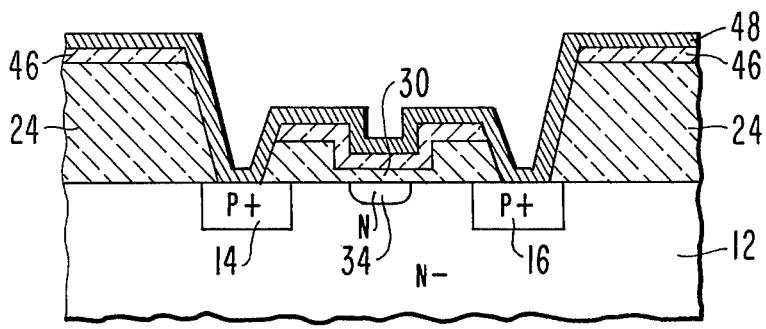

Referring to FIG. 4, the photoresist layer 38 is then removed and the thin oxide layer 30 is grown over the region 34 to a thickness of about 20 Å. Thereafter, the silicon nitride layer 46 is deposited in any well known manner, such as by combining silane (SiH$_4$) and ammonia (NH$_3$) in a deposition reactor heated to about 800° C. for about 30 minutes. Finally, openings for the drain and source interconnect electrodes of the MNOS IGFET are formed using standard photolithographic techniques.

Then, a metal layer 48 is deposited over the surface of the device. The metal layer 48 is defined to form the interconnects 20, 22 and the gate using standard photolithographic techniques to obtain the device shown in FIG. 1.

By using the present invention the region 34 can be formed in such a way that it does not extend completely across the oxide layer 28. Yet, it can be implanted without a second photolithography step. An additional advantage of the present method is that it is inherently self-aligning which means that the region 34 will always be properly spaced relative to the opening formed in the oxide layer 28.

While the present invention has been described with reference to a P-channel MNOS transistor as the preferred embodiment of the invention, one of ordinary skill in the art will recognize that the invention is also applicable to the manufacture of N-channel MNOS transistors.

What is claimed is:

1. A method of making a MNOS transistor comprising the steps of:
    (a) selecting a body of semiconductor material of a first conductivity type;
    (b) forming a source and a drain spaced therefrom of opposite conductivity type in said body extending to a surface of said body;
    (c) forming an oxide layer over the surface of said body at least between said source and said drain;
    (d) applying a masking layer over the surface of said oxide;
    (e) forming an opening in said masking layer between said source and said drain which exposes a portion of said oxide layer;
    (f) forming a second opening in the exposed portion of said oxide, said second opening being wider than said opening in said masking layer, whereby the edges of said oxide will be laterally displaced beneath the edges of the opening in said masking layer; then
    (g) implanting ions of said first conductivity type through said opening in said masking layer whereby a region of the same conductivity type but having a greater conductivity will be formed beneath said opening in said masking layer, said region being narrower there and entirely within said second opening;
    (h) removing said masking layer;
    (i) forming a thin oxide over the exposed portion of said surface;
    (j) applying a silicon nitride layer over said oxide layer at least between said source and said drain;
    (k) forming a conductive gate over said silicon nitride layer at least between said source and said drain; and
    (l) providing electrical contacts to said source and said drain.

2. The method of claim 1 wherein said step of forming a second opening comprises the step of etching the exposed portions of said oxide layer for a time sufficient to expose the surface of said body and to etch laterally beneath said masking layer.

3. The method of claim 2 wherein said body of semiconductor material is selected to be of N type silicon.

4. The method of claim 3 wherein said oxide layer is a silicon dioxide layer and said step of forming an oxide layer is accomplished by thermally growing a silicon dioxide layer on the surface of said silicon body.

5. The method of claim 4 wherein said step of applying a masking layer is accomplished by applying a layer of photoresist material over the surface of said oxide and said step of forming an opening in said masking layer is accomplished by photolithographically defining and developing areas of said photoresist layer.

6. The method of claim 5 wherein said step of implanting ions is accomplished by ion implanting donor ions selected from the group consisting of phosphorus and arsenic.

7. The method of claim 6 wherein said step of forming a thermal oxide is accomplished by thermally growing a silicon dioxide layer on the surface of said body to a thickness of about 20 A.

8. The method of claim 7 wherein said step of applying a silicon nitride layer is accomplished by combining silane and arsenic in a deposition reactor heated to about 800° C. for about 30 minutes.

9. The method of claim 8 wherein said step of forming a conductive gate is accomplished by applying a metal layer over the surface of said nitride layer and then photolithographically defining said metal layer.

10. The method of claim 9 wherein said step of providing electrical contacts is accomplished by photolithographically defining openings to expose said source and said drain, applying a metal layer which contacts said source and said drain, and then photolithographically defining said metal layer.

* * * * *